US012540415B2

(12) United States Patent
Lee et al.

(10) Patent No.: US 12,540,415 B2
(45) Date of Patent: Feb. 3, 2026

(54) ENERGY-SAVING INGOT GROWING DEVICE

(71) Applicants: HANWHA SOLUTIONS CORPORATION, Seoul (KR); HANWHA CORPORATION, Seoul (KR)

(72) Inventors: Young Jun Lee, Seoul (KR); Jin Sung Park, Seoul (KR); Han Woong Jeon, Seoul (KR)

(73) Assignees: HANWHA SOLUTIONS CORPORATION, Seoul (KR); HANWHA CORPORATION, Seoul (KR)

( * ) Notice: Subject to any disclaimer, the term of this patent is extended or adjusted under 35 U.S.C. 154(b) by 329 days.

(21) Appl. No.: 18/248,072

(22) PCT Filed: Sep. 16, 2021

(86) PCT No.: PCT/KR2021/012740

§ 371 (c)(1),
(2) Date: Apr. 6, 2023

(87) PCT Pub. No.: WO2022/075629

PCT Pub. Date: Apr. 14, 2022

(65) Prior Publication Data

US 2023/0374697 A1 Nov. 23, 2023

(30) Foreign Application Priority Data

Oct. 7, 2020 (KR) ........................ 10-2020-0129595

(51) Int. Cl.
*C30B 15/26* (2006.01)
*C30B 15/10* (2006.01)
*C30B 29/06* (2006.01)

(52) U.S. Cl.
CPC .............. *C30B 15/26* (2013.01); *C30B 15/10* (2013.01); *C30B 29/06* (2013.01)

(58) Field of Classification Search
CPC .......... C30B 15/10; C30B 15/26; C30B 29/06
See application file for complete search history.

(56) References Cited

U.S. PATENT DOCUMENTS 4,184,907 A 1/1980 Yates
4,390,835 A * 6/1983 Elkateb .................... H02H 3/34 361/79

(Continued)

FOREIGN PATENT DOCUMENTS

JP 10197158 A * 7/1998
JP 2020079192 A 5/2020

(Continued)

*Primary Examiner* — Hua Qi
(74) *Attorney, Agent, or Firm* — Harvest IP Law, LLP

(57) ABSTRACT

An energy-saving ingot growing device is disclosed. The ingot growing device according to the present invention comprises: a chamber having provided therein a crucible heated by a heat source in order to melt silicon; a side surface insulating material provided inside the chamber so as to insulate the side surface of the crucible; and an observation part provided to penetrate the chamber and the side surface insulating material so that the inside of the crucible can be observed.

10 Claims, 4 Drawing Sheets

1

(56) References Cited

U.S. PATENT DOCUMENTS

| | | | | |
|---|---|---|---|---|
| 2008/0053372 | A1* | 3/2008 | Anttila | C30B 29/20 117/200 |
| 2013/0032083 | A1* | 2/2013 | Kitagawa | C30B 29/06 117/14 |
| 2016/0319458 | A1* | 11/2016 | Kim | C30B 15/26 |

FOREIGN PATENT DOCUMENTS

| | | | | |
|---|---|---|---|---|
| KR | 20100033108 | A | * | 3/2010 |
| KR | 1020100033108 | A | | 3/2010 |
| KR | 10-1727722 | B1 | | 4/2017 |
| KR | 10-2271830 | B1 | | 7/2021 |

* cited by examiner

ENERGY-SAVING INGOT GROWING DEVICE

CROSS-REFERENCE TO RELATED APPLICATION(S)

This application is a National Stage of International Application No. PCT/KR2021/012740 filed Sep. 16, 2021, claiming priority based on Korean Patent Application No. 10-2020-0129595 filed Oct. 7, 2020, the disclosure of which is incorporated herein by reference in its entirety.

TECHNICAL FIELD

The present invention relates to a Czochralski ingot growing device, and more specifically to an energy-saving device for growing an ingot.

BACKGROUND ART

In general, a grower using the Czochralski method uses a vision camera such as CCD and the like and a sensor for diameter measurement (laser sensor, etc.) in order to measure the diameter of an ingot and the melt level of silicon which is melted inside a crucible, and it measures the diameter of a growing ingot or the height level of a molten silicon liquid surface through a view port which is installed on the top or side of the chamber.

In the Czochralski grower of the related art, an insulating material is provided to insulate the thermal energy loss in the side and lower portions of a crucible, but the installation of an insulating material is limited at the upper and upper side portions of a grower in order to install vision cameras such as CCD and the like and laser sensors to measure the ingot diameter, and to secure a field of view between sensors such as cameras and objects to be measured. In particular, when the ingot diameter is measured through a view port, it is necessary to secure a field of view to directly observe a contact area between the ingot and the molten silicon, and thus, since radiant energy is directly emitted from the entire molten silicon liquid surface including the contact area through the view port, it greatly affects energy loss.

DISCLOSURE

Technical Problem

The present invention is directed to providing an energy-saving device for growing an ingot having a structure in which the thermal insulation performance in a chamber is improved by providing an insulating material not only on the upper side of the chamber, but also on the side portion and lower side of the chamber of the device for growing an ingot.

Technical Solution

The energy-saving device for growing an ingot according to an aspect of the present invention may include a chamber in which a crucible which is heated by a heat source in order to melt silicon is installed therein; a side surface insulating material which is installed inside the chamber so as to insulate the side surface of the crucible; and an observation part which is installed to penetrate the chamber and the side surface insulating material such that the inside of the crucible can be observed.

In this case, the observation part may include a lens member for observing the inside of the crucible; and an extension member which penetrates the chamber and the side surface insulating material to extend into the chamber, and in which the lens member is installed at an inner end.

In this case, the energy-saving device for growing an ingot may further include a cooling passage which is provided inside the extension member.

In this case, the energy-saving device for growing an ingot may further include a gas passage which is provided on one side of the extension member and through which gas discharged into the lens member flows in order to clean the lens member.

In this case, the extension member may be formed such that the length to be inserted into the chamber can be adjusted.

In this case, the extension member may be formed such that the end to be inserted into the chamber is inclined in a downward direction.

In this case, a reflector for covering the upper portion of the crucible except for the central portion where the ingot grows may be installed on the upper portion of the crucible, and the observation part may be disposed between the reflector and the crucible.

In this case, in the reflector, an insulating material may be provided over the entire body forming the reflector, except for the central portion where the ingot grows.

In this case, an upper insulation material may be installed inside the chamber in the remaining portion of the crucible except for the central portion through which the ingot passes.

In this case, the observation part may include a driving part for retractably operating the extension member toward the inside of the chamber.

In this case, the operation part may include a frame which is fixed to the chamber; a driving member which is installed to be linearly movable along the guide and fixed to one side of the extension member; and a driving cylinder having one end fixed to the frame and one end portion fixed to the driving member, and wherein as the driving cylinder is driven, the driving member moves forward and backward in the extension direction such that the length of the extension member entering the chamber is adjusted.

Advantageous Effects

According to the above configuration, in the energy-saving device for growing an ingot according to the present invention, since a view port is removed, the insulation effect can be increased by installing an insulating material in a part up to the molten silicon liquid surface observed from the view port.

In the energy-saving device for growing an ingot according to the present invention, since it is not necessary to cut a part of the reflector to measure the ingot diameter, the insulation efficiency can be increased by installing an insulating material over the entire reflector body.

MODES OF THE INVENTION

Figure 1:
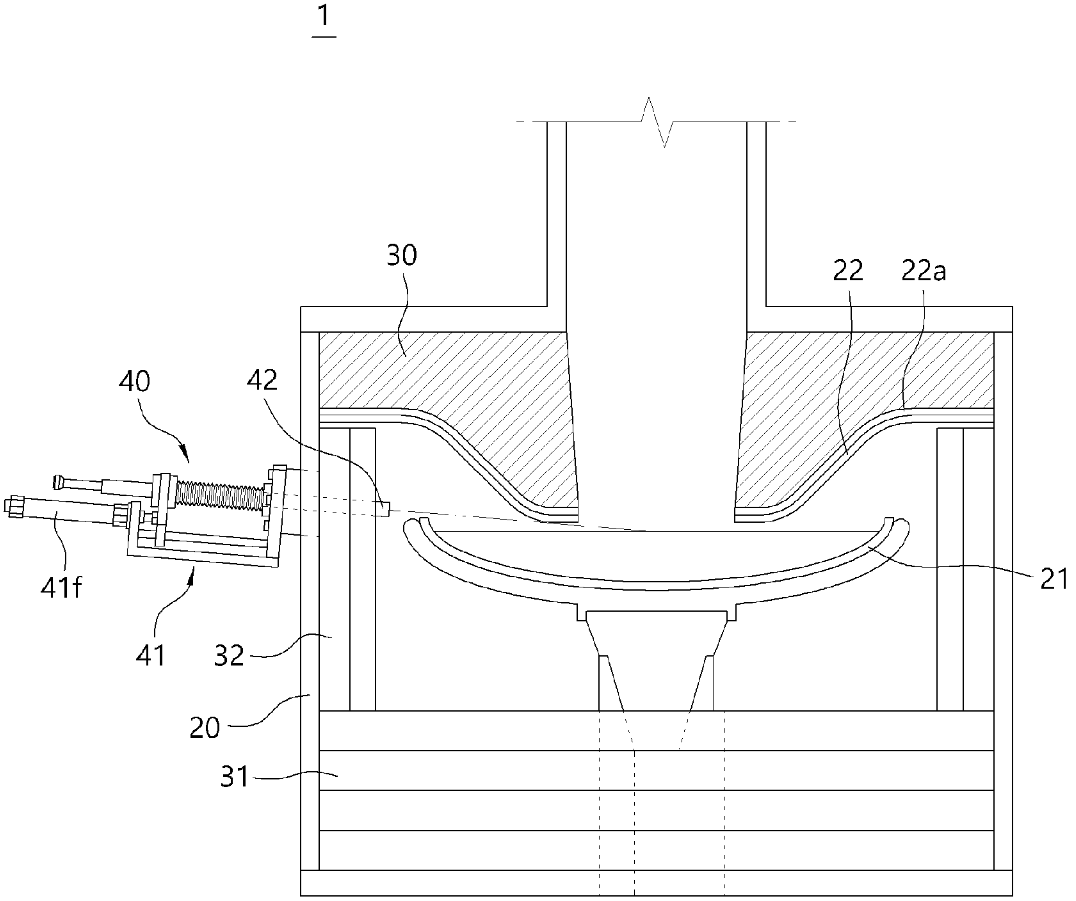
FIG. 1 is a cross-sectional view of the energy-saving device for growing an ingot according to an exemplary embodiment of the present invention.

Terms and words used in the present specification and claims should not be construed as limited to their usual or dictionary definition, and they should be interpreted as a meaning and concept consistent with the technical idea of the present invention based on the principle that inventors may appropriately define the terms and concept in order to describe their own invention in the best way.

Accordingly, the exemplary embodiments described in the present specification and the configurations shown in the drawings correspond to preferred exemplary embodiments of the present invention, and do not represent all the technical spirit of the present invention, and thus, the configurations may have various examples of equivalent and modification that can replace them at the time of filing the present invention.

It is understood that the terms "include" or "have", when used in the present specification, are intended to describe the presence of stated features, integers, steps, operations, elements, components and/or a combination thereof but do not preclude the possibility of the presence or addition of one or more other features, integers, steps, operations, elements, components or a combination thereof.

The presence of an element in/on "front", "rear", "upper or above or top" or "lower or below or bottom" of another element includes not only being disposed in/on "front", "rear", "upper or above or top" or "lower or below or bottom" directly in contact with other elements, but also cases in which another element being disposed in the middle, unless otherwise specified. In addition, unless otherwise specified, that an element is "connected" to another element includes not only direct connection to each other but also indirect connection to each other.

Hereinafter, the energy-saving device for growing an ingot 1 according to an exemplary embodiment of the present invention will be described with reference to the drawings. In the present specification, in terms of describing the device for growing an ingot according to an exemplary embodiment of the present invention, the configurations that are not related to the contents of the present invention are not illustrated in detail or omitted for the sake of simplification of the drawings, and the device for growing an ingot according to the present invention will be described by mainly focusing on the contents that are related to the spirit of the invention.

With reference to FIGS. 1 to 4, the energy-saving device for growing an ingot 1 according to an exemplary embodiment of the present invention includes a chamber 20, insulating materials 30, 31, 32 and an observation part 40.

In the chamber 20, a crucible 21 which is heated by a heat source for melting silicon is installed therein. During normal operation, the internal temperature of the chamber 20 is maintained at about 1,500° C. Therefore, since the temperature difference with the outside is very large and various gases are supplied and generated, it must be isolated from the outside by the chamber 20. In order to maintain such a high temperature, a heat source must be continuously supplied to the crucible 21, and conventionally, the heater uses electricity as its energy source, and energy saving for temperature maintenance is most reflected in the cost of the product. Therefore, although it is important to efficiently consume heat, the thermal insulation performance also greatly affects energy consumption. Accordingly, it is possible to lower the unit cost of producing an ingot by improving the thermal insulation performance.

In this case, the side and lower surfaces of the chamber 20 can be sufficiently insulated because there is no passage through which the ingot passes. However, it is not easy to install other components, including an insulating material, in the passage through which the ingot is grown, because the ingot is grown while the seed is usually descended and then ascended in the upper portion of the chamber 20. Further, in the device for growing an ingot according to the related art, since the chamber 20 is provided with a view port as well as a passage through which the ingot passes on the inner upper portion of the chamber 20, sufficient insulation has been difficult to achieve.

According to an exemplary embodiment of the present invention, when the upper insulating material 30 to be described below is installed inside the upper chamber 20, it is installed throughout the ingot passage without interfering with the ingot passage. Accordingly, it is possible to insulate almost all parts of the chamber 20 except for the passage through which the ingot passes, and thus, it is possible to save a lot of energy.

In this case, since the crucible 21 is formed in a plate shape or a cylindrical shape, the chamber 20 also has a cylindrical shape. It is as described above that a passage for growing an ingot is formed in the upper center of the chamber 20.

Referring to FIG. 1, the insulating material includes an upper insulating material 30 which is installed on the inner upper portion of the chamber 20, a side surface insulating material 32 which is installed inside the chamber 20 to insulate the side surface of the crucible 21, and a lower insulating material 31 which is installed to insulate the lower portion of the crucible 21.

In this case, in the upper insulating material 30, the ingot growth passage is opened and all other parts are installed. The device for growing an ingot according to an exemplary embodiment of the present invention is formed such that a view port is omitted, and a thermal insulating material may be installed even in a part where the view port is conventionally installed. Since the heat source generally moves upward, the addition of the upper insulating material 30 is a factor that can greatly increase the thermal insulation efficiency.

In this way, in order to install the upper insulating material inside the chamber, with reference to FIGS. 1 to 4, the observation part 40 of the device for growing an ingot 1 according to an exemplary embodiment of the present invention may be installed to penetrate the chamber 20 and the side surface insulating material 32 such that it is possible to withstand high heat inside the crucible 21 and observe the inside of the crucible 21.

In this case, according to an exemplary embodiment of the present invention, the observation part 40 includes an extension member 42. The extension member 42 extends into the chamber 20 by penetrating the chamber 20 and the side surface insulating material 32, and it may have the shape of a long rod in which a lens member 45 for observing the inside of the crucible 21 is installed at an end thereof.

The extension member 42 forms the body of the observation part 40, and since it must be installed by penetrating two layers of the chamber 20 and the side surface insulating material 32, it may be formed in the shape of a long rod. Certainly, the cross-sectional shape may be formed in a circular shape.

In this case, the lens member 45 is mounted on the free end of the extension member 42 of the observation part 40, and the lens member 45 may be equipped with a heat-resistant lens member 45 for a camera. For example, a vision camera such as a CCD and the like and a laser sensor may be mounted. Accordingly, the lens member 45 portion of the end may be formed to be able to be assembled and disassembled with the extension member 42 to be exchangeable.

In this case, the extension member 42 may include a cooling passage **42*e*** for cooling.

Figure 3:
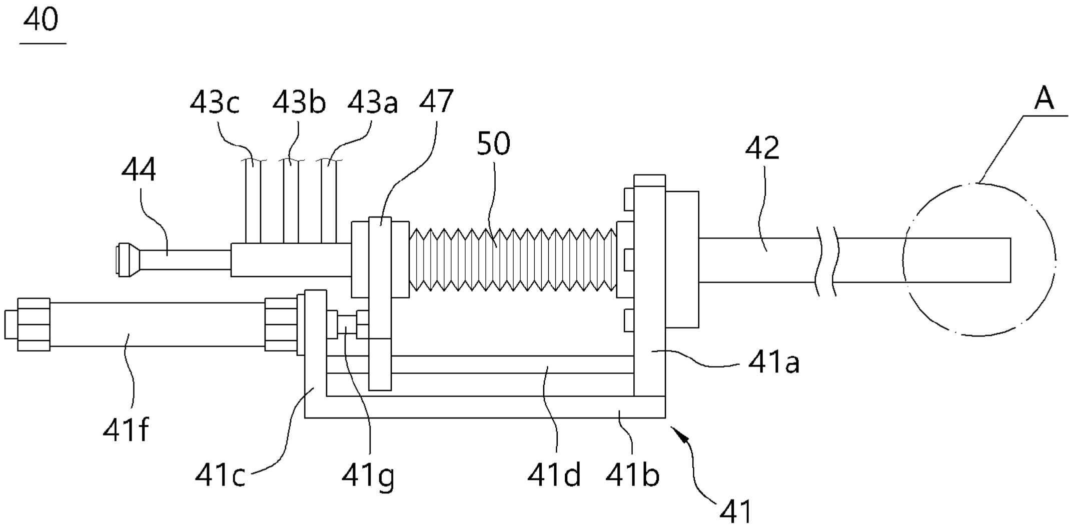
FIG. 3 is a front view of an observation part, which is a component of the energy-saving device for growing an ingot according to an exemplary embodiment of the present invention.
Figure 4:
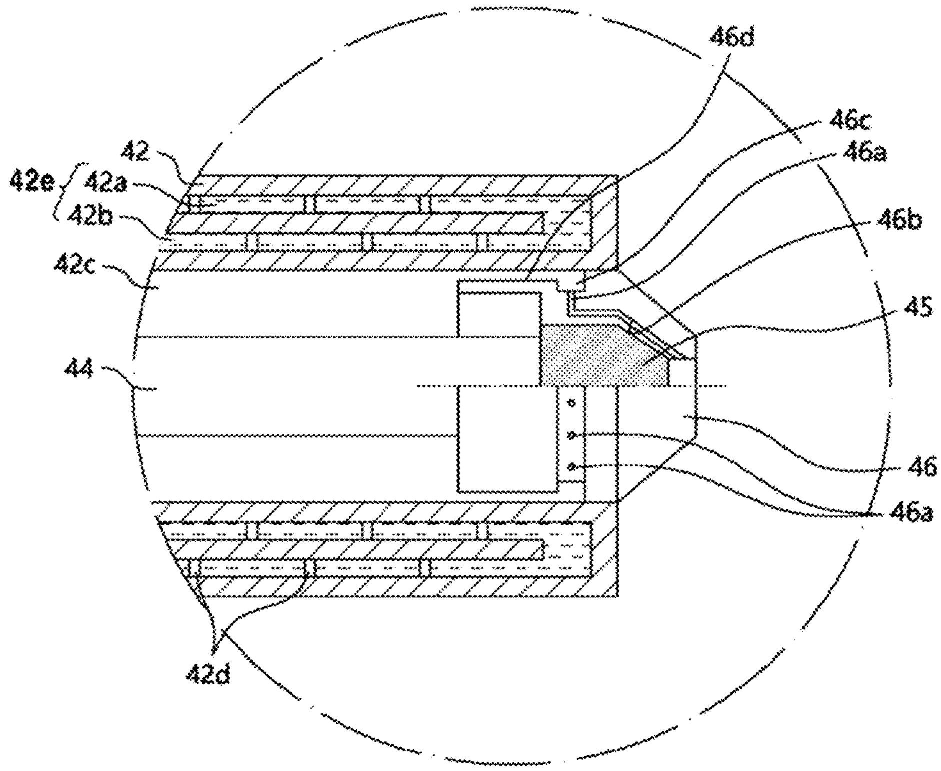
FIG. 4 is an enlarged partial cross-sectional view of part A illustrated in FIG. 3.

Referring to FIGS. 3 and 4, the extension member 42 is provided with three jackets **42*a*, 42*b*, 42*c***.

The extension member 42 has cooling passages **42*e* formed in two jackets from the outside. That is, the extension member 42 has first and second jackets 42*a*, 42*b*, which are cooling passages 42*e*, formed from the outside, the two jackets are connected to each other at both ends, and it is formed such that the cooling water is able to circulate in a spiral shape by a partition wall 42*d***.

In addition, a central passage member 44 is installed in the third jacket **42*c* in the center so as to be electrically and physically connected to the lens member 45** at the end.

In this case, a gas passage through which gas for cleaning the lens member 45 flows may be formed in the third jacket **42*c* of the extension member 42**.

In this case, the gas discharged to the lens member 45 may include at least argon gas. The front surface of the lens member 45 is not only cleaned but also cooled by the discharge of the gas.

In this case, the lens member 45 may be mounted on the socket 46 and formed such that only the front surface is exposed. In addition, the socket 46 is formed with a reduced diameter portion **46*d* whose diameter is reduced on the rear side, and a gas passage 46*b* may be formed between the reduced diameter portion 46*d* and the inner wall of the extension member 42** to allow gas to flow therein.

In addition, an annular groove portion **46*c* is formed between the reduced diameter portion 46*d* of the socket 46 and the front portion of the socket 46, and a plurality of gas holes 46*a* may be formed in the annular groove portion 46*c* along the annual groove portion 46*c***.

In this case, the gas hole **46*a* extends along the body of the socket 46 to form a gas passage, and the gas passage end extends to the front side of the lens member 45 such that the spirally circulating gas may be discharged in front of the lens member 45**.

Accordingly, not only the temperature of the lens member 45 is lowered by the discharge of the gas, but also it is possible to prevent the lens member 45 from becoming cloudy due to the deposition of oxide, and thus, more accurate observation is possible.

In this case, an inlet line **43*a* and an outlet line 43*b* through which the cooling water circulates are respectively connected to the rear of the extension member 42, and the other gas line 43*c* may be formed such that gas is connected to the third jacket 42*c***.

Accordingly, the cooling water continues to circulate through the inlet line **43*a* and the outlet line 43*b* to continuously cool the extension member 42, and at the same time, gas is also supplied through the gas line 43*c* such that it is continuously supplied to the front surface of the lens member 45** for cooling and cleaning.

In this case, referring to FIG. 1, the extension member 42 may be installed such that the end to be inserted into the chamber 20 is inclined downward. By observing the inside of the crucible 21 in this state, it is possible to measure more accurate temperatures, melt levels of molten silicon, ingot diameters and the like.

Herein, the lens member 45 does not have to be necessarily installed to be horizontal with the extension member 42, and certainly, it may be installed to be inclined to one side at the end of the extension member 42. This angle adjustment can be reflected and adjusted during design.

Meanwhile, the extension member 42 may be installed such that the length to be inserted into the chamber 20 can be adjusted. That is, the observation part 40 may include a driving part 41 for moving the extension member 42 forward and backward.

Figure 2:
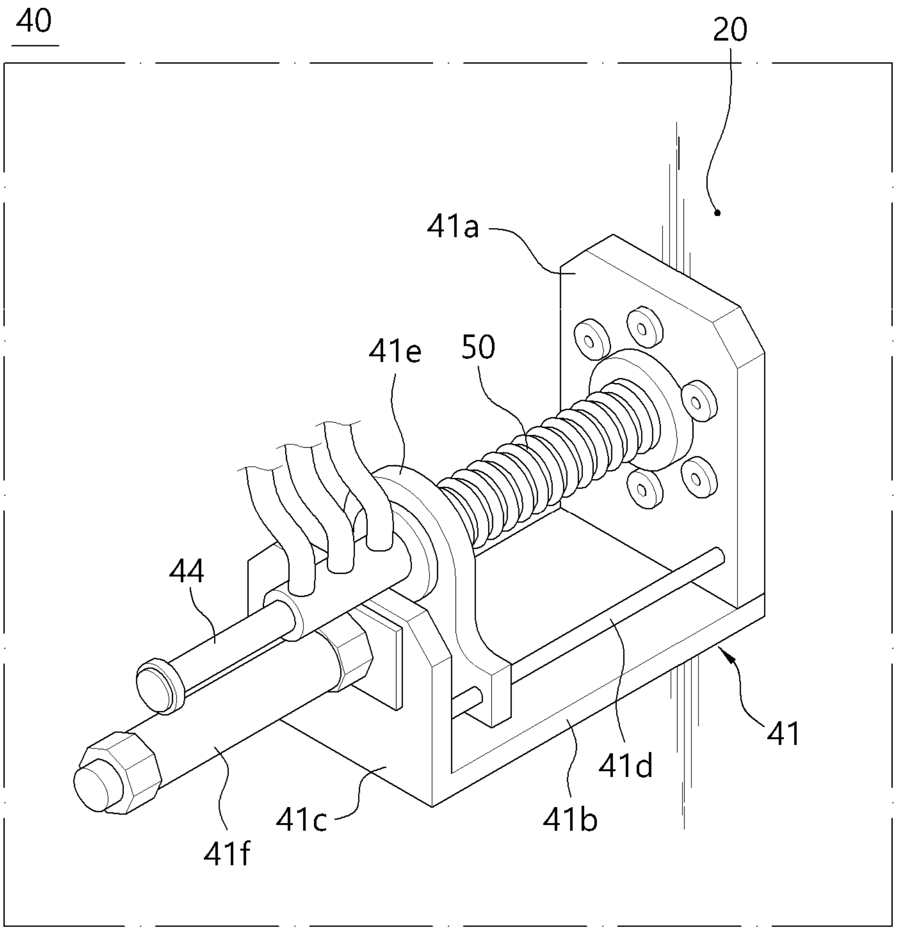
FIG. 2 is a perspective view of an observation part, which is a component of the energy-saving device for growing an ingot according to an exemplary embodiment of the present invention.

In this case, referring to FIGS. 1 to 3, the driving part 41 may include a frame, a guide **41*d*, a driving cylinder 41*f*** and a driving member.

In this case, the frame may be fixedly installed on the side surface of the chamber 20 in a bracket type. The frame may include a first vertical plate **41*a* which is fixed to the side surface of the chamber 20, a second vertical plate 41*c* which is spaced apart from the first vertical plate 41*a*, and a horizontal plate 41*b* which connects and fixes the first vertical plate 41*a* and the second vertical plate 41*c*** from the lower side.

Since the first vertical plate **41*a* is fixedly installed on the side surface of the chamber 20, the frame and other components may be entirely supported by the first vertical plate 41*a***.

In this case, two of the guide **41*d* may be connected and formed between the first vertical plate 41*a* and the second vertical plate 41*c***.

In this case, the driving cylinder **41*f* has a body fixed to the second vertical plate 41*c*, and the end of the driving rod 41*g* which is linearly driven reciprocally by the driving cylinder 41*f* may be fixed to the driving member 47. Accordingly, the driving member 47 may move forward and backward according to the operation of the driving cylinder 41*f***.

In this case, since the driving member 47 may be formed with through-holes into which the guide **41*d* is inserted, it may move forward and backward in a straight line along the guide 41*d*, and operate according to the operation of the driving cylinder 41*f*** as described above.

In this case, the extension member 42 is partially fixed to the driving member 47 such that it may move forward and backward as the driving member 47 moves forward and backward.

An end of the extension member 42 may be positioned inside the chamber 20 to penetrate the first vertical plate **41*a*, the chamber 20 and the side surface insulating material 32**.

In this case, a sealing corrugated pipe 50 is installed to surround the extension member 42, and one end of the sealing corrugated pipe 50 is fixedly installed to the driving member 47, and the other end thereof is fixedly installed to the first vertical plate **41*a* such that it is possible to suppress the heat transfer and gas outflow inside the chamber 20**.

In this way, since the position of the end of the extension member 42 can be adjusted by driving the driving cylinder **41*f*, the position of the lens member 45** or the laser sensor to be observed is adjusted, and thus, for example, it is possible to more accurately measure the diameter of an ingot, the height level of molten silicon and the like.

Meanwhile, a reflector 22 for covering the upper portion of the crucible 21 is installed on the upper portion of the crucible 21, except for the central portion where the ingot grows, and the observation part 40 may be disposed between the reflector 22 and the crucible 21.

In this case, the reflector 22 is a component that is installed to keep the heat of the crucible 21.

In this case, the reflector 22 may be installed with an insulating material over the entire body except for the central portion where the ingot grows. In the case of the related art, since a part of the reflector 22 must be removed so that the ingot and the molten silicon can be observed through a view port, an insulating material cannot be installed in that part either. However, since the reflector 22 according to an aspect of the present invention has a structure in which the extension member 42 of the observation part 40 is disposed under the reflector 22, an insulating material is installed over the entire body of the reflector 22 so as to further increase the insulation efficiency.

Referring to FIG. 1, a crucible 21 is installed inside the chamber 20 of the device for growing an ingot 1 according to an exemplary embodiment of the present invention, and the melting of silicon is performed by a heater therein.

In this case, a lower insulating material 31, a side surface insulating material 32 and an upper insulating material 30 are installed inside the chamber 20, respectively. The upper insulating material 30 is installed over the entire upper portion of the inner wall of the chamber 20 except for the ingot passage.

In this case, the extension member 42 of the observation part 40 is installed by penetrating the chamber 20 and the side surface insulating material 32. As illustrated, the extension member 42 is installed to be able to move forward and backward such that the distance can be adjusted.

In this way, since the conventional view port is removed, the insulating material may be disposed almost over the entire interior of the chamber 20. In addition, since the part that interferes with observation through the view port is removed from the reflector 22, it is possible to install an insulating material on the entire body of the reflector 22 without any gaps. Accordingly, the thermal insulation efficiency inside the chamber 20 is significantly increased.

Referring to FIGS. 2 and 3, in the observation part 40 of the device for growing an ingot 1 according to one aspect of the present invention, the extension member 42 of the observation part 40 has an end to be inserted into the chamber 20, and the middle rear end portion is formed to be fixed to the driving member 47.

The driving member 47 is guided by penetrating and inserting two guides 41*d* therethrough. Both ends of the guide 41*d* are fixedly installed between the first and second vertical plates 41*a*, 41*c*, and the first and second vertical plates 41*a*, 41*c* are connected and fixed by a horizontal plate 41*b* to constitute a frame.

A driving cylinder 41*f* is fixed to the rear side of the second vertical plate 41*c*, and the driving rod 41*g* of the driving cylinder 41*f* penetrates the second vertical plate 41*c* to be fixed to the driving member 47.

Therefore, according to the operation of the driving cylinder 41*f*, the driving rod 41*g* and the driven vertical plate move forward and backward according to the guidance of the guide 41*d*. As a result, the extension member 42 of the observation part 40 moves forward and backward together with the driving member 47, and accordingly, the length of the extension member 42 to be inserted into the chamber 20 may be adjusted.

In this case, the inlet line 43*a* and the outlet line 43*b* of cooling water are connected to the extended member 42 to cool the extended member 42 while the cooling water is circulated, and gas is continuously supplied to the front side of the lens member 45 through the remaining gas lines 43*c* to clean and cool the front surface of the lens member 45 at the same time.

Referring to FIG. 4, the end of the extension member 42 is illustrated in detail. As illustrated, the lens member 45 is installed in the socket 46 at the end of the extension member 42 and assembled to the extension member 42. The extension member 42 is composed of three jackets, and in the first and second jackets 42*a*, 42*b*, the extension member 42 may be cooled by forming a cooling passage 42*e* while cooling water circulates through the inlet line 43*a* and the outlet line 43*b* along a spiral direction by the partition wall 42*d*.

Gas including argon gas is supplied to the third jacket 42*c* of the extension member 42 through the gas line 43*c*, and the gas passes through the gas passages 46*b*, the annular groove portion 46*c* and the gas hole 46*a* and is supplied to the front surface of the lens member 45 to cool and clean the lens member 45.

In this way, the device for growing an ingot 1 according to an exemplary embodiment of the present invention is not provided with a view port, and the observation part 40 including a small extension member 42 in the endoscopic style is installed by penetrating the side surfaces of the chamber such that an insulating material may be installed in much more parts, and thus, the insulation efficiency can be maximized. In addition, since the inside of the crucible 21 can be observed from an almost similar height instead of observing the inside of the crucible 21 from the upper side as in the view port, it is possible to improve the accuracy of measurement result values such as the measurement of diameters, the height level of molten silicon and the like.

Although the exemplary embodiments of the present invention have been described, the spirit of the present invention is not limited by the exemplary embodiments presented herein, and a person skilled in the art who understands the spirit of the present invention may easily suggest other exemplary embodiments by modifying, changing, deleting or adding components within the scope of the same spirit, but this will also be within the spirit of the present invention.

INDUSTRIAL APPLICABILITY

The present invention can be applied to a device for growing an ingot for manufacturing a solar wafer.

The invention claimed is:

1. An energy-saving device for growing an ingot, comprising:

a chamber in which a crucible which is heated by a heat source in order to melt silicon is installed therein;

a side surface insulating material which is installed inside the chamber so as to insulate the side surface of the crucible;

an observation part which is installed to penetrate the chamber and the side surface insulating material such that an inside of the crucible can be observed;

a reflector for covering an upper portion of the crucible; and an upper insulation material spaced apart from the side surface insulating material and located above the reflector, wherein the observation part is disposed between the reflector and the crucible, and penetrates the side surface insulating material located below the reflector.

2. The energy-saving device of claim 1, wherein the observation part comprises:

a lens member for observing the inside of the crucible; and an extension member which penetrates the chamber and the side surface insulating material to extend into the chamber, and in which the lens member is installed at an inner end.

3. The energy-saving device of claim 2, further comprising:

a cooling passage which is provided inside the extension member.

4. The energy-saving device of claim 2, further comprising:

a gas passage which is provided on one side of the extension member and through which gas discharged into the lens member flows in order to clean the lens member.

5. The energy-saving device of claim 2, wherein the extension member is formed such that a length to be inserted into the chamber can be adjusted.

6. The energy-saving device of claim 2, wherein the extension member is formed such that an end to be inserted into the chamber is inclined in a downward direction.

7. The energy-saving device of claim 1, wherein in the reflector, an insulating material is provided over an entire body forming the reflector, except for a central portion where the ingot grows.

8. The energy-saving device of claim 1, wherein the upper insulation material is installed inside the chamber in a remaining portion of the upper portion of the crucible except for a central portion through which the ingot passes.

9. The energy-saving device of claim 2, wherein the observation part comprises a driving part for retractably operating the extension member toward the inside of the chamber.

10. The energy-saving device of claim 9, wherein the driving part comprises:

a frame which is fixed to the chamber;

a driving member which is installed to be linearly movable along a guide and fixed to one side of the extension member; and a driving cylinder having one end fixed to the frame and one end portion fixed to the driving member, and wherein as the driving cylinder is driven, the driving member moves forward and backward in the extension direction such that a length of the extension member entering the chamber is adjusted.

* * * * *